United States Patent [19]
Jang

[11] Patent Number: 6,004,863
[45] Date of Patent: Dec. 21, 1999

[54] NON-POLISHING SACRIFICIAL LAYER ETCHBACK PLANARIZING METHOD FOR FORMING A PLANARIZED APERTURE FILL LAYER

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/072,995

[22] Filed: May 6, 1998

[51] Int. Cl.$^6$ .................................................. H01L 21/76
[52] U.S. Cl. ........................... 438/427; 438/424; 438/296
[58] Field of Search ................................. 438/424, 427, 438/296, 976

[56] References Cited

U.S. PATENT DOCUMENTS

| | | | |
|---|---|---|---|
| 4,954,459 | 9/1990 | Avanzino et al. | 437/228 |
| 4,962,064 | 10/1990 | Haskell et al. | 437/228 |
| 5,492,858 | 2/1996 | Bose et al. | 437/67 |
| 5,494,854 | 2/1996 | Jain | 437/195 |
| 5,498,565 | 3/1996 | Gocho et al. | 438/427 |
| 5,665,635 | 9/1997 | Kwon et al. | 438/427 |
| 5,721,173 | 2/1998 | Yano et al. | 438/424 |
| 5,851,899 | 12/1998 | Weigand | 438/427 |
| 5,943,590 | 8/1999 | Wang et al. | 438/427 |

OTHER PUBLICATIONS

S. Nag et al. "Comparative Evaluation of Gap–Fill Dielectrics in Shallow Trench Isolation for Sub 0.25$\mu$m Technologies", IEDM, '96, IEEE pp. 841–844.

*Primary Examiner*—Trung Dang
*Attorney, Agent, or Firm*—George O. Saile; Stephen B. Ackerman; Alek P. Szecsy

[57] ABSTRACT

A non-polishing planarizing method for forming a planarized aperture fill layer within an aperture within a topographic substrate layer. There is first provided a topographic substrate layer employed within a microelectronics fabrication, where the topographic substrate layer comprises a series of mesas of substantially equivalent height but of differing widths, separated by a series of apertures. The series of mesas has formed thereupon a co-extensive series of patterned sacrificial layers. There is then formed upon the topographic substrate layer and the series of patterned sacrificial layers a blanket aperture fill layer employing a deposition and sputter method to fill the series of apertures to a planarizing thickness greater than the height of the mesas, while simultaneously forming a series of protrusions of the blanket aperture fill layer corresponding with the locations of the series of patterned sacrificial layers. There is then masked with a mask layer the blanket aperture fill layer to leave exposed at least a protrusion of the blanket aperture fill layer formed upon a widest of the patterned sacrificial layers. There is then etched while employing the mask layer and a first etch method at least a portion of the protrusion. There is then stripped from the microelectronics fabrication the mask layer. There is then etched while employing an isotropic second etch method which is selective to a remaining blanket aperture fill layer with respect to the patterned sacrificial layers the blanket aperture fill layer to form a series of patterned planarized aperture fill layers separated by the series of mesas, where the thickness of each patterned planarized aperture fill layer is substantially equivalent to the height of the mesas. Finally, there is stripped while employing an isotropic third etch method which is selective to the patterned sacrificial layers with respect to the patterned planarized aperture fill layers the patterned sacrificial layers from the topographic substrate layer to leave remaining the series of patterned planarized aperture fill layers substantially co-planar with the series of mesas which comprises the topographic substrate layer.

8 Claims, 5 Drawing Sheets

NON-POLISHING SACRIFICIAL LAYER ETCHBACK PLANARIZING METHOD FOR FORMING A PLANARIZED APERTURE FILL LAYER

BACKGROUND OF THE INVENTION

1. Field of the Invention

The present invention relates generally to methods for forming patterned planarized aperture fill layers within apertures within topographic substrate layers employed within microelectronics fabrications. More particularly, the present invention relates to non-polishing methods for forming patterned planarized aperture fill layers within apertures within topographic substrate layers employed within microelectronics fabrications.

2. Description of the Related Art

Integrated circuit microelectronics fabrications are formed from semiconductor substrates within and upon whose surfaces are formed integrated circuit devices. The integrated circuit devices are connected internally and externally to the semiconductor substrates upon which they are formed through use of patterned conductor layers which are separated by dielectric layers.

As integrated circuit microelectronics fabrication integration levels have increased and integrated circuit device and patterned conductor layer dimensions have decreased, it has become more prevalent in the art of integrated circuit microelectronics fabrication to employ trench isolation methods, such as but not limited to shallow trench isolation (STI) methods and recessed oxide isolation (ROI) methods, to form planarized trench isolation regions within isolation trenches within semiconductor substrates in order to separate active regions of the semiconductor substrates within and upon which are formed integrated circuit devices.

Such shallow trench isolation (STI) methods and recessed oxide isolation (ROI) methods are desirable for forming planarized trench isolation regions within isolation trenches within semiconductor substrates employed within integrated circuit microelectronics fabrications since shallow trench isolation (STI) methods and recessed oxide isolation (ROI) methods typically provide planarized trench isolation regions which are nominally co-planar with the surfaces of adjoining active regions of a semiconductor substrate which they separate. Such nominally coplanar planarized trench isolation regions and adjoining active regions of a semiconductor substrate generally optimize an attenuated depth of focus typically achievable with an advanced photoexposure apparatus employed when forming advanced integrated circuit devices and patterned conductor layers within an advanced integrated circuit microelectronics fabrication.

While shallow trench isolation (STI) methods and recessed oxide isolation (ROI) methods are thus desirable when forming planarized trench isolation regions within isolation trenches within semiconductor substrates employed within advanced integrated circuit microelectronics fabrications, shallow trench isolation (STI) methods and recessed oxide isolation (ROI) methods are nonetheless not entirely without problems when forming planarized trench isolation regions within isolation trenches within semiconductor substrates employed within advanced integrated circuit microelectronics fabrications. In particular, it is often difficult to form when employing shallow trench isolation (STI) methods which in turn employ chemical mechanical polish (CMP) planarizing methods for forming planarized trench isolation regions within isolation trenches within semiconductor substrates employed within integrated circuit microelectronics fabrications planarized trench isolation regions which are uniformly and economically planarized. In that regard, chemical mechanical polish (CMP) planarizing methods often provide non-uniformly chemical mechanical polish (CMP) planarized trench isolation regions, such as chemical mechanical polish (CMP) planarized trench isolation regions whose surfaces are dished, when such chemical mechanical polish (CMP) planarized trench isolation regions are formed within particularly wide isolation trenches of greater than about 300 microns width. In addition, chemical mechanical polish (CMP) planarizing methods also generally add complexity and cost to integrated circuit microelectronics fabrication methods, since such chemical mechanical polish (CMP) planarizing methods require additional integrated circuit microelectronics fabrication processing equipment and attendant capital expenditures.

It is therefore desirable within the art of integrated circuit microelectronics fabrication to provide non-polishing methods and materials through which planarized trench isolation regions may be formed within isolation trenches within semiconductor substrates employed within integrated circuit microelectronics fabrications to provide integrated circuit microelectronics fabrications fabricated with attenuated process complexity, attenuated integrated circuit microelectronics fabrication cost and enhanced planarized trench isolation region uniformity. In a more general sense, it is also desirable within the art of microelectronics fabrication, but not necessarily the art of integrated circuit microelectronics fabrication, to provide methods and materials through which planarized aperture fill layers, which need not necessarily be planarized trench isolation regions, may be formed within apertures within topographic substrate layers employed within microelectronics fabrications to provide microelectronics fabrications fabricated with attenuated process complexity, attenuated microelectronics fabrication cost and enhanced planarized aperture fill layer uniformity.

It is towards the foregoing objects that the present invention is both specifically and more generally directed.

Various planarizing methods have been disclosed in the art of integrated circuit microelectronics fabrication for forming planarized aperture fill layers within apertures within topographic substrate layers employed within integrated circuit microelectronics fabrications.

For example, Nag et al., in "Comparative Evaluation of Gap-Fill Dielectrics in Shallow Trench Isolation for Sub-0.25 $\mu$m Technologies," IEDM 96, IEEE, pp. 841–44, compares a series of physical and electrical properties for each of several dielectric materials which may be employed within chemical mechanical polish (CMP) planarized trench isolation regions formed within isolation trenches within semiconductor substrates employed within integrated circuit microelectronics fabrications.

In addition, Avanzino et al., in U.S. Pat. No. 4,954,459, discloses a polishing planarizing method for forming a planarized aperture fill dielectric layer within an aperture, such as but not limited to an isolation trench, within a topographic substrate layer, such as but not limited to a semiconductor substrate, employed within an integrated circuit microelectronics fabrication. The method employs a conformal dielectric oxide layer formed over the topographic substrate layer, where upper lying portions of the conformal dielectric oxide layer corresponding with upper lying features of an underlying topography of the topographic substrate layer are selectively etched prior to a polish planarizing of the etched conformal dielectric oxide layer so formed.

Further, Haskall et al., in U.S. Pat. No. 4,962,064, discloses an alternative polish planarizing method for forming a planarized aperture fill dielectric layer within an aperture, such as but not limited to an isolation trench, within a topographic substrate layer, such as but not limited to a semiconductor substrate, employed within an integrated circuit microelectronics fabrication. The method employs a conformal dielectric oxide layer formed upon the topographic substrate layer, where the conformal dielectric oxide layer has a conformal planarizing material layer formed thereupon. An upper portion of the conformal planarizing material layer and a lower portion of the conformal planarizing material layer are then successively removed employing two separate polish planarizing process steps having interposed therebetween an etch process step which employs the lower portion of the conformal planarizing material layer as an etch mask layer.

Still further, Bose et al., in U.S. Pat. No. 5,492,858, discloses a polish planarizing method for forming a planarized trench isolation region within an isolation trench of high aspect ratio within a semiconductor substrate employed within an integrated circuit microelectronics fabrication. The method employs forming a silicon nitride trench liner layer within the isolation trench prior forming within the isolation trench a conformal oxide dielectric layer which is subsequently steam annealed and polish planarized to form the planarized trench isolation region exhibiting enhanced properties.

Still yet further, Jain, in U.S. Pat. No. 5,494,854, discloses a polish planarizing method for simultaneously planarizing a series of patterned conductor layers of equivalent thickness, but differing aspect ratios, formed within an integrated circuit microelectronics fabrication. The method employs forming a first gap filling dielectric layer for planarizing apertures formed interposed between at least the patterns which comprise a high aspect ratio portion of the patterned conductor layers, where the first gap filling dielectric layer has formed thereupon a second dielectric layer which is polish planarized with enhanced throughput, planarity and uniformity.

Finally, Kwon et al., in U.S. Pat. No. 5,665,635, discloses an etchback planarizing method for forming a planarized trench isolation region within an isolation trench within a semiconductor substrate employed within an integrated circuit microelectronics fabrication. The method employs a surface treatment of an isolation trench liner layer and an isolation trench masking layer in a fashion such that a trench fill dielectric layer when subsequently formed upon the isolation trench liner layer and the isolation trench masking layer is formed more rapidly within the isolation trench than upon the isolation trench masking layer, thus allowing the etchback planarizing method to efficiently form a planarized trench isolation region within the isolation trench.

Desirable within the art of integrated circuit microelectronics fabrication are non-polishing methods and materials through which planarized trench isolation regions may be formed within isolation trenches within semiconductor substrates employed within integrated circuit microelectronics fabrications to provide integrated circuit microelectronics fabrications fabricated with attenuated process complexity, attenuated integrated circuit microelectronics fabrication cost and enhanced planarized trench isolation region uniformity. More generally desirable within the art of microelectronics fabrication, but not necessarily the art of integrated circuit microelectronics fabrication, are methods and materials through which planarized aperture fill layers, but not necessarily planarized trench isolation regions, may be formed within apertures within topographic substrate layers employed within microelectronics fabrications to provide microelectronics fabrications fabricated with attenuated process complexity, attenuated microelectronics fabrication cost and enhanced planarized aperture fill layer uniformity.

It is towards the foregoing objects that the present invention is both specifically and more generally directed.

SUMMARY OF THE INVENTION

A first object of the present invention is to provide a method for forming a planarized aperture fill layer within an aperture within a topographic substrate layer employed within a microelectronics fabrication.

A second object of the present invention is to provide a method in accord with the first object of the present invention, where the method is a non-polishing method.

A third object of the present invention is to provide a method in accord with the first object of the present invention or the second object of the present invention, where the microelectronics fabrication is an integrated circuit microelectronics fabrication, the topographic substrate layer is a semiconductor substrate employed within the integrated circuit microelectronics fabrication, the aperture is an isolation trench formed within the semiconductor substrate and the planarized aperture fill layer is a planarized trench isolation region formed within the isolation trench.

A fourth object of the present invention is to provide a method in accord with the first object of the present invention, the second object of the present invention or the third object of the present invention, which method is readily commercially implemented.

In accord with the objects of the present invention, there is provided by the present invention a non-polishing planarizing method for forming a planarized aperture fill layer within an aperture within a topographic substrate layer employed within a microelectronics fabrication. To practice the method of the present invention, there is first provided a topographic substrate layer employed within a microelectronics fabrication. The topographic substrate layer comprises a series of mesas of substantially equivalent height but of differing widths, where the series of mesas is separated by a series of apertures. The series of mesas has formed upon their upper surfaces a corresponding series of patterned sacrificial layers, where each patterned sacrificial layer within the series of patterned sacrificial layers has a width coextensive with a width of a mesa upon which it is formed. There is then formed upon the topographic substrate layer and the series of patterned sacrificial layers a blanket aperture fill layer, where the blanket aperture fill layer is formed employing a deposition and sputter method. The blanket aperture fill layer fills the series of apertures to a planarizing thickness greater than the height of the mesas while simultaneously forming a series of protrusions of the blanket aperture fill layer corresponding with the locations of the series of patterned sacrificial layers. There is then masked with a mask layer the blanket aperture fill layer to leave exposed a protrusion of the blanket aperture fill layer formed upon a widest of the patterned sacrificial layers. There is then etched while employing the mask layer and a first etch method at least a portion of the protrusion of the blanket aperture fill layer formed upon the widest of the patterned sacrificial layers to form a remaining blanket aperture fill layer. There is then stripped from the remaining blanket aperture fill layer the mask layer. There is then etched while employing an isotropic second etch method which is selective to the remaining blanket aperture fill layer with respect to the patterned sacrificial layers the remaining blanket aperture fill layer to form a series of patterned planarized aperture fill layers separated by the series of mesas, where the thickness of each patterned planarized aperture fill layer is substantially equivalent to the height of the mesas. Finally, there is then stripped while employing an isotropic third etch method which is selective to the patterned sacrificial layers with respect to the patterned planarized aperture fill layers the patterned sacrificial layers from the topographic substrate layer to leave remaining the series of patterned planarized aperture fill layers substantially co-planar with the series of mesas which comprises the topographic substrate layer.

The present invention provides a non-polishing planarizing method for forming a planarized aperture fill layer within an aperture within a topographic substrate layer employed within a microelectronics fabrication. The method of the present invention realizes the foregoing objects by employing: (1) a series of patterned sacrificial layers formed upon and co-extensive with a series of mesas which define a series of apertures within the topographic substrate layer; (2) a deposition and sputtering method for forming a blanket aperture fill layer within the series of apertures to a planarized thickness greater than the height of the mesas, where the blanket aperture fill layer also has a series of protrusions formed therein corresponding with the series of patterned sacrificial layers; (3) a masked first etch etching of at least a portion of a protrusion of the blanket aperture fill layer formed upon a widest of the patterned sacrificial layers; (4) an isotropic second etch etching selective to the blanket aperture fill layer with respect to the series of patterned sacrificial layers to provide within the series of apertures a series of patterned planarized aperture fill layers of height substantially equivalent to the height of the series of mesas; and (5) an isotropic third etch stripping selective to the series of patterned sacrificial layers with respect to the series of patterned planarized aperture fill layers of series of patterned sacrificial layers from the series of mesas. When employing the preceding sequence of process steps there may be formed within a microelectronics fabrication a planarized aperture fill layer within an aperture within a topographic substrate layer within the microelectronics fabrication while employing a non-polishing method.

The method of the present invention may be employed where the microelectronics fabrication is an integrated circuit microelectronics fabrication, the topographic substrate layer is a semiconductor substrate employed within the integrated circuit microelectronics fabrication, the aperture is an isolation trench formed within the semiconductor substrate and the planarized aperture fill layer is a planarized trench isolation region formed within the isolation trench. Although the method of the present invention is most likely to provide value when forming a planarized trench isolation region within an isolation trench within a semiconductor substrate employed within an integrated circuit microelectronics fabrication, the method of the present invention may also be employed in forming planarized aperture fill layers including but not limited to planarized aperture fill conductor layers, planarized aperture fill semiconductor layers and planarized aperture fill dielectric layers within apertures within topographic substrate layers including but not limited to topographic conductor substrate layers, topographic semiconductor substrate layers, topographic dielectric substrate layers and composites thereof within microelectronics fabrications including but not limited to integrated circuit microelectronics fabrications, solar cell microelectronics fabrications, ceramic substrate microelectronics fabrications and flat panel display microelectronics fabrications.

The method of the present invention is readily commercially implemented. The method of the present invention employs microelectronics fabrication methods and materials as are otherwise generally known in the art of microelectronics fabrication. Since it is at least in part the process control within the method of the present invention which provides the method of the present invention rather than the existence of the methods and materials employed within the method of the present invention which provides the method of the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a non-polishing planarizing method for forming a planarized aperture fill layer within an aperture within a topographic substrate layer employed within a microelectronics fabrication. The method of the present invention realizes the foregoing objects by sequentially employing: (1) a series of patterned sacrificial layers formed upon and co-extensive with a series of mesas which define a series of apertures within the topographic substrate layer; (2) a deposition and sputtering method for forming a blanket aperture fill layer within the series of apertures to a planarized thickness greater than the height of the series of mesas, where the blanket aperture fill layer has a series of protrusions formed therein corresponding with the series of patterned sacrificial layers; (3) a masked first etch etching of at least a portion of a protrusion of the blanket aperture fill layer formed upon the widest of the patterned sacrificial layers; (4) an isotropic second etch etching selective to the blanket aperture fill layer with respect to the series of patterned sacrificial layers to provide a series of patterned planarized aperture fill layers of thickness substantially equivalent to the height of the series of mesas; and (5) an isotropic third etch stripping selective to the sacrificial layers with respect to the patterned planarized aperture fill layers of the series of patterned sacrificial layers from the series of mesas. When employing the preceding sequence of process steps there may be formed within a microelectronics fabrication a planarized aperture fill layer within an aperture within a topographic substrate layer within the microelectronics fabrication while employing a non-polishing method.

Although the method of the present invention is most likely to provide value when forming a planarized trench isolation region within an isolation trench within a semiconductor substrate employed within an integrated circuit microelectronics fabrication, the method of the present invention may also be employed in forming planarized aperture fill layers including but not limited to planarized aperture fill conductor layers, planarized aperture fill semiconductor layers and planarized aperture fill dielectric layers within apertures within topographic substrate layers including but not limited to topographic conductor substrate layers, topographic semiconductor substrate layers, topographic dielectric substrate layers and composites thereof, within microelectronics fabrications including but not limited to integrated circuit microelectronics fabrications, solar cell microelectronics fabrications, ceramic substrate microelectronics fabrications and flat panel display microelectronics fabrications.

First Preferred Embodiment

Figure 1A:
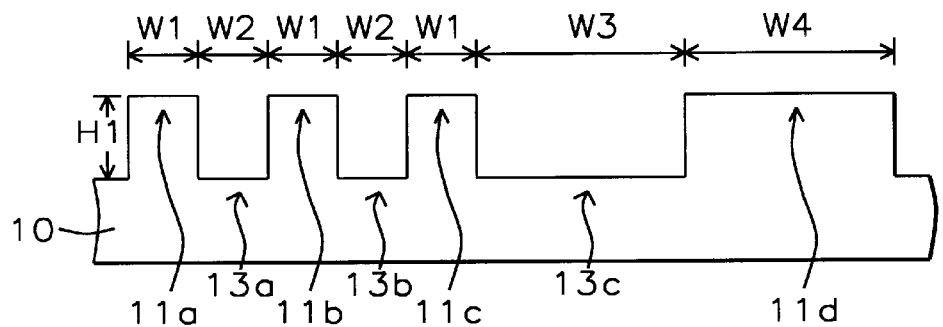
FIG. 1 to FIG. 6 show a series of schematic cross-sectional diagrams illustrating the results of forming within a microelectronics fabrication in accord with a general embodiment of the present invention which comprises a first preferred embodiment of the present invention a series of patterned planarized aperture fill layers within a series of apertures within a topographic substrate layer while employing the method of the present invention.

Referring now to FIG. 1A to FIG. 6, there is shown a series of schematic cross-sectional diagrams illustrating the results of forming within a microelectronics fabrication in accord with a general embodiment of the present invention which comprises a first preferred embodiment of the present invention a series of patterned planarized aperture fill layers within a series of apertures within a topographic substrate layer while employing the method of the present invention. Shown in FIG. 1A and FIG. 1B is a pair of schematic cross-sectional diagrams illustrating a pair of topographic substrate layers which may be employed within the first preferred embodiment of the present invention.

Shown in FIG. 1A is a topographic substrate layer 10, where the topography within the topographic substrate layer 10 is achieved by selective etching of portions of a planar substrate layer from which is formed the topographic substrate layer 10. Within the first preferred embodiment of the present invention, the topographic substrate layer 10 may be selected from the group of topographic substrate layers including but not limited to topographic conductor substrate layers, topographic semiconductor substrate layers and topographic dielectric substrate layers.

As is illustrated within the schematic cross-sectional diagram of FIG. 1A, the topographic substrate layer 10 has formed therein a series of narrow mesas 11a, 11b and 11c each of width W1 separated by a pair of narrow apertures 13a and 13b each of width W2, where the series of narrow mesas 11a, 11b and 11c is separated from a wide mesa 11d of width W4 by an wide aperture 13c of width W3. Within the first preferred embodiment of the present invention: (1) each of the narrow mesas 11a, 11b or 11c has the width W1 preferably from about 0.2 to about 0.5 microns; (2) the wide mesa 11d has the width W4 preferably greater than about 1.0 microns; (3) each of the narrow apertures 13a and 13b has the width W2 preferably from about 0.2 to about 0.5 microns; and (4) the wide aperture 13b has the width W3 preferably from about 100 to about 500 microns angstroms. Within the first preferred embodiment of the present invention, each of the mesas 11a, 11b, 11c or 11d and each of the apertures 13a, 13b, or 13c has a height H1 of from about 3000 to about 6000 angstroms within the topographic substrate layer 10.

Figure 1B:
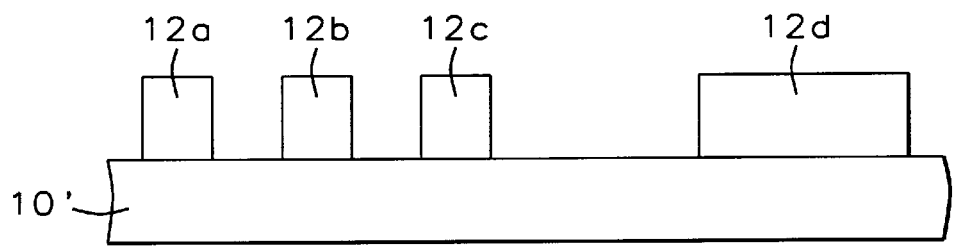

Referring now to FIG. 1B there is shown an alternative topographic substrate layer which may be employed within the method of the present invention. Shown in FIG. 1B is a planar substrate layer 10' having formed thereupon a series of patterned layers 12a, 12b, 12c and 12d, where the patterned layers 12a, 12b, 12c and 12d, in conjunction with the planar substrate layer 10', define a series of mesas and apertures equivalent to the series of mesas 11a, 11b, 11c and 11d and the series of apertures 13a, 13b and 13c defined by the topographic substrate layer 10 whose schematic cross-sectional diagram is illustrated in FIG. 1A. Within the schematic cross-sectional diagram of FIG. 1B, the planar substrate layer 10' may be selected from the group of planar substrate layers including but not limited to planar conductor substrate layers, planar semiconductor substrate layers and planar dielectric substrate layers. Similarly, the patterned layers 12a, 12b, 12c and 12d within the schematic cross-sectional diagram of FIG. 1B may be independently selected from the group of patterned layers including but not limited to patterned conductor layers, patterned semiconductor layers and patterned dielectric layers. Thus, the topographic substrate layer as illustrated within the schematic cross-sectional diagram of FIG. 1B may in the aggregate be formed employing conductor materials, semiconductor materials, dielectric materials or composites thereof.

Although either the topographic substrate layer 10 as illustrated within the schematic cross-sectional diagram of FIG. 1A or the planar substrate layer 10' having formed thereupon the patterned layers 12a, 12b, 12c and 12d as illustrated within the schematic cross-sectional diagram of FIG. 1B may be employed with equivalent results within the first preferred embodiment of the present invention, the remaining description of the first preferred embodiment of the present invention will, for simplicity only, be disclosed in accord with further processing of the topographic substrate layer 10 whose schematic cross-sectional diagram is illustrated in FIG. 1A.

Figure 2:
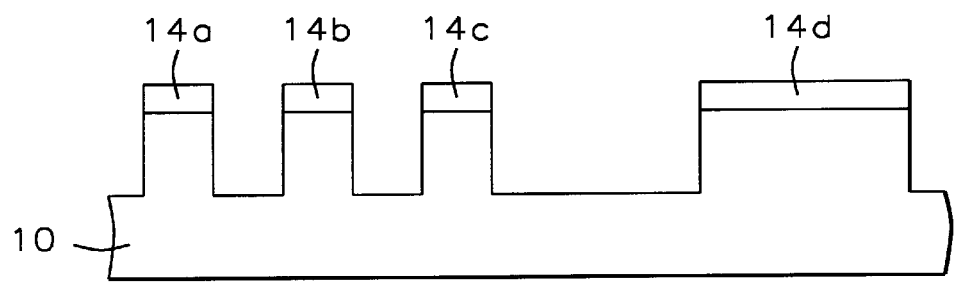

Referring now to FIG. 2, there is shown a schematic cross-sectional diagram illustrating the results of further process of the topographic substrate layer 10 whose schematic cross-sectional diagram is illustrated in FIG. 1A. Shown in FIG. 2 is a schematic cross-sectional diagram of a topographic substrate layer otherwise equivalent to the topographic substrate layer 10 whose schematic cross-sectional diagram is illustrated in FIG. 1A, but wherein there is formed co-extensive upon each mesa 11a, 11b, 11c or 11d within the series of mesas 11a, 11b, 11c and 11d a series of patterned sacrificial layers 14a, 14b, 14c and 14d.

Within the first preferred embodiment of the present invention, the patterned sacrificial layers 14a, 14b, 14c and 14d may be formed employing any material which is susceptible to an etchant which does not substantially etch a series of patterned planarized aperture fill layers which is subsequently formed into the apertures 13a, 13b and 13c. Such materials may include, but are not limited to, conductor materials, semiconductor materials and dielectric materials. Preferably, each patterned sacrificial layer 14a, 14b, 14c or 14d is formed to a thickness of from about 1000 to about 2000 angstroms upon the corresponding mesa 11a, 11b, 11c or 11d.

Figure 3:
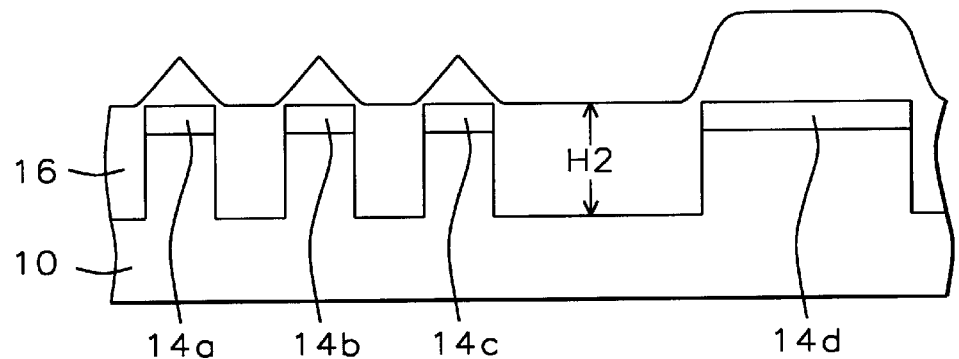

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein there is formed upon the topographic substrate layer 10 and the series of patterned sacrificial layers 14a, 14b, 14c and 14d a blanket aperture fill layer 16 to a planarizing thickness H2 within each of the apertures 13a, 13b and 13c greater than the height H1 of the mesas 11a, 11b, 11c and 11d. Within the first preferred embodiment of the present invention, the blanket aperture fill layer 16 is formed employing a deposition and sputter method selected from the group including but not limited to sequential deposition and sputter methods and simultaneous deposition and sputter methods. Such deposition and sputter methods are understood within the art of microelectronics fabrication to provide planarizing properties of blanket aperture fill layers formed within apertures, while simultaneously providing protrusions of the blanket aperture fill layers upon mesas, such as the patterned sacrificial layers 14a, 14b, 14c and 14d as illustrated within the schematic cross-sectional diagram of FIG. 3.

Figure 4A:
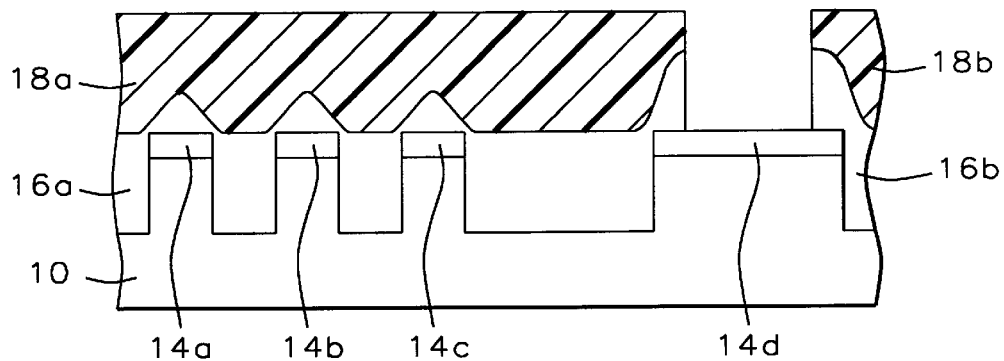
Figure 4B:
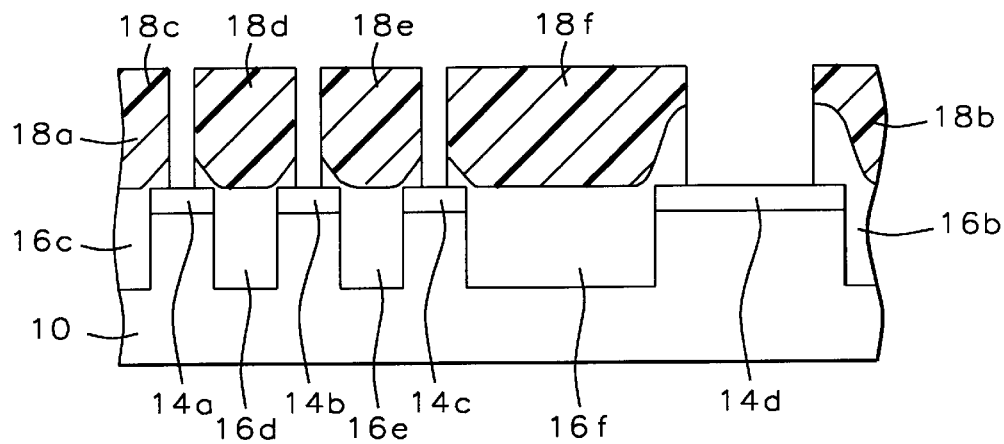

Referring now to FIG. 4A and FIG. 4B, there is shown a pair of schematic cross-sectional diagrams illustrating the results of two alternatives for further processing of the microelectronics fabrication whose schematic cross-sectional diagram is illustrated in FIG. 3. Shown in FIG. 4A is a schematic cross-sectional diagram of a microelectronics fabrication otherwise equivalent to the microelectronics fabrication whose schematic cross-sectional diagram is illustrated in FIG. 3, but wherein: (1) there has been formed upon the blanket aperture fill layer 16 a pair of patterned photoresist layers 18a and 18b which provide an aperture exposing a portion of the protrusion of blanket aperture fill layer 16 formed above the patterned sacrificial layer 14d; and (2) there has subsequently been etched employing a first etch method the blanket aperture fill layer 16 to form the patterned aperture fill layers 16a and 16b.

Within the first preferred embodiment of the present invention, the patterned photoresist layers 18a and 18b may be formed employing methods and materials as are conventional in the art of microelectronics fabrication, including photoresist materials selected from the general groups of photoresist materials including but not limited to positive photoresist materials and negative photoresist materials. Preferably, each of the patterned photoresist layers 18a and 18b is formed to a thickness of from about 7000 to about 15000 angstroms.

Similarly, the first etch method employed for forming the patterned aperture fill layers 16a and 16b from the blanket aperture fill layer 16 may employ any of several etchants which may be employed for etching the material from which is formed the blanket aperture fill layer 16. Such etchants may include but are not limited to: (1) plasma etchants, which are typically anisotropic etchants which yield a microelectronics fabrication structure analogous or equivalent to the microelectronics fabrication structure whose schematic cross-sectional diagram is illustrated in FIG. 4A, but may under certain process conditions also be isotropic etchants; and (2) wet chemical etchants which are typically isotropic etchants which is contradistinction with the schematic cross-sectional diagram of the microelectronics fabrication structure whose schematic cross-sectional diagram is illustrated in FIG. 4A will typically exhibit undercutting of the patterned aperture fill layers 16a and 16b beneath the corresponding patterned photoresist layers 18a and 18b.

As is similarly understood by a person skilled in the art, although the schematic cross-sectional diagram of FIG. 4A illustrates a selective and complete anisotropic etching of the blanket aperture fill layer 16 to form the patterned aperture fill layers 16a and 16b, within the first preferred embodiment of the present invention it is only required that a portion of the protrusion of the blanket aperture fill layer 16 formed upon the patterned sacrificial layer 14d in turn formed upon the wide mesa 11d be etched employing the first etch method. Thus, within the first preferred embodiment of the present invention, the protrusion of the blanket aperture fill layer 16 formed upon the patterned sacrificial layer 14d need not be completely etched to form the patterned aperture fill layers 16a and 16b. Similarly, it is also feasible within the first preferred embodiment of the present invention that there may also be some overetching into, but not through, the patterned sacrificial layer 14d under circumstances where the blanket aperture fill layer 16 is completely etched when forming the patterned aperture fill layers 16a and 16b.

With respect to the microelectronics fabrication whose schematic cross-sectional diagram is illustrated in FIG. 4B, the microelectronics fabrication whose schematic cross-sectional diagram is illustrated in FIG. 4B is otherwise equivalent to the microelectronics fabrication whose schematic cross-sectional diagram is illustrated in FIG. 4A, but: (1) there has been formed a series of patterned photoresist layers 18b, 18c, 18d, 18e and 18f which define a series of apertures which expose portions of the series of protrusions of the blanket aperture fill layer 16 above each of the patterned sacrificial layers 14a, 14b, 14c and 14d; and (2) each of those portions of the series of protrusions of the blanket aperture fill layer 16 has been anisotropically etched to reach the corresponding patterned sacrificial layers 14a, 14b, 14c and 14d while forming the corresponding series of patterned aperture fill layers 16b, 16c, 16d, 16e and 16f. The methods, materials and limitations employed when forming the microelectronics fabrication whose schematic cross-sectional diagram is illustrated in FIG. 4B from the microelectronics fabrication whose schematic cross-sectional diagram is illustrated in FIG. 3 are otherwise analogous or equivalent to the methods, materials and limitations employed when forming the microelectronics fabrication whose schematic cross-sectional diagram is illustrated in FIG. 4A from the microelectronics fabrication whose schematic cross-sectional diagram is illustrated in FIG. 3, with the exception that a wet etch method for forming the series of patterned aperture fill layers 16b, 16c, 16d, 16e and 16f from the blanket aperture fill layer 16 is typically not preferred.

While a microelectronics fabrication formed in accord with either FIG. 4A or FIG. 4B may be employed within the first preferred embodiment of the present invention with analogous or equivalent results, microelectronics fabrications formed in accord with the schematic cross-sectional diagram of FIG. 4B are particularly desirable within the first preferred embodiment of the present invention when widths of narrow patterned sacrificial layers, such as the patterned sacrificial layers 14a, 14b and 14c are greater than about 0.20 microns.

Similarly, as is also understood by a person skilled in the art, the patterned photoresist layers 18b, 18c, 18d, 18e and 18f may, at least theoretically be formed employing a reverse tone to a photomask employed when forming within the topographic substrate layer 10 the series of mesas 11a, 11b, 11c and 11d and the series of apertures 13a, 13b and 13c as illustrated within the schematic cross-sectional diagram of FIG. 1. An exact reverse tone may, however, be undesirable due to mis-registration tolerance considerations.

Finally, although microelectronics fabrications formed in accord with either FIG. 4A or FIG. 4B may be employed within the first preferred embodiment of the present invention with analogous or equivalent results, for simplicity only, further processing of a microelectronics fabrication formed in accord with the first preferred embodiment of the present invention is disclosed within the context of further processing of the microelectronics fabrication whose schematic cross-sectional diagram is illustrated in FIG. 4A.

Figure 5:
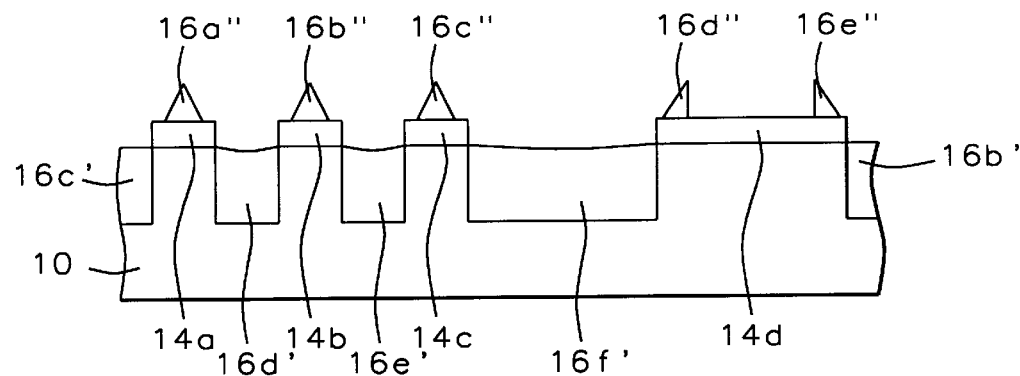

Referring now to FIG. 5, there is shown a schematic cross-sectional diagram illustrating the results of further processing of the microelectronics fabrication whose schematic cross-sectional diagram is illustrated in FIG. 4A. Shown in FIG. 5 is a schematic cross-sectional diagram of a microelectronics fabrication otherwise equivalent to the microelectronics fabrication whose schematic cross-sectional diagram is illustrated in FIG. 4A, but wherein in part the patterned photoresist layers 18a and 18b have been stripped from the microelectronics fabrication. The patterned photoresist layers 18a and 18b may be stripped from the microelectronics fabrication whose schematic cross-sectional diagram is illustrated in FIG. 4A to provide the microelectronics fabrication whose schematic cross-sectional diagram is illustrated in FIG. 5 employing photoresist stripping methods as are conventional in the art of microelectronics fabrication. Such photoresist stripping methods will typically include, but are not limited to, oxygen plasma photoresist stripping methods and wet chemical photoresist stripping methods.

Subsequent to stripping the patterned photoresist layers 18a and 18b from the microelectronics fabrication whose schematic cross-sectional diagram is illustrated in FIG. 4A, there is etched employing a second etch method the patterned aperture fill layers 16a and 16b to form a series of etched patterned planarized aperture fill layers 16b', 16c', 16d', 16e' and 16f' of thickness substantially equal to the height H1 of the mesas 11a, 11b, 11c and 11d, as illustrated within the schematic cross-sectional diagram of FIG. 1. As employed within the first preferred embodiment of the present invention, the term "substantially equivalent" is intended to accommodate minor variations of the deposition and sputter method from which is formed the blanket aperture fill layer 16, which in conjunction with variations with the first etch method will typically provide a variation of the thickness of the etched patterned planarized aperture fill layers 16b', 16c', 16d', 16e' and 16f' of from about 200 to about 400 angstroms. As is illustrated within the schematic cross-sectional diagram of FIG. 5, incident to etching the patterned aperture fill layers 16a and 16b to form the etched patterned planarized aperture fill layers 16b', 16c', 16d', 16e' and 16f', there is simultaneously formed upon the series patterned sacrificial layers 14a, 14b, 14c and 14d a corresponding series of etched patterned aperture fill residue layers 16a", 16b", 16c", 16d" and 16e'.

When etching the patterned aperture fill layers 16a and 16b to form the series of etched patterned planarized aperture fill layers 16b', 16c', 16d', 16e' and 16f' and the series of etched patterned aperture fill residue layers 16a", 16b", 16c", 16d" and 16e', there is preferably employed within the first preferred embodiment of the present invention an isotropic etchant which is specific to the material from which is formed the patterned aperture fill layers 16a and 16b with respect to the material from which is formed the patterned sacrificial layers 14a, 14b, 14c and 14d. Preferably, the isotropic etchant has an etch rate ratio of the patterned aperture fill layers 16a and 16b with respect to the patterned sacrificial layers 14a, 14b, 14c and 14d of greater than about 10:1. Such isotropic etchants are typically, although not exclusively, wet chemical etchants.

Figure 6:
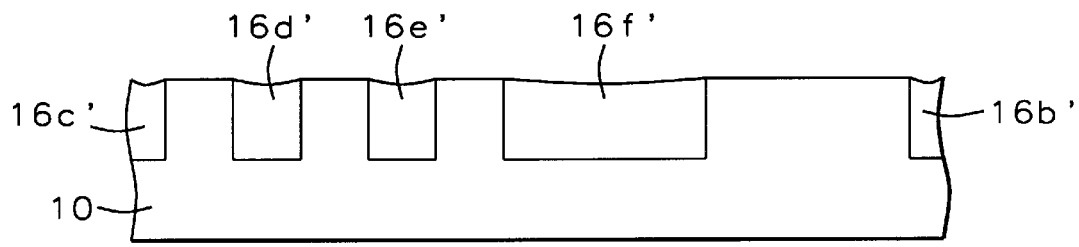

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein there is stripped from the microelectronics fabrication the patterned sacrificial layers 14a, 14b, 14c and 14d, which incident thereto also remove from the microelectronics fabrication the etched patterned aperture fill residue layers 16a", 16b", 16c", 16d" and 16e'. When stripping from the microelectronics fabrication whose schematic cross-sectional diagram is illustrated in FIG. 5 the patterned sacrificial layers 14a, 14b, 14c and 14d, and the etched patterned aperture fill residue layers 16a", 16b", 16c", 16d" and 16e", to form the microelectronics fabrication whose schematic cross-sectional diagram is illustrated in FIG. 6, there is employed an isotropic etchant which is selective to the material from which is formed the patterned sacrificial layers 14a, 14b, 14c and 14d with respect to the material from which is formed the etched patterned planarized aperture fill layers 16b', 16c', 16d', 16e' and 16f'. Preferably the isotropic etchant has an etch rate ratio for the patterned sacrificial layers 14a, 14b, 14c and 14d with respect to the etched patterned planarized aperture fill layers 16b', 16c', 16d', 16e' and 16f' of greater than about 10:1. Such isotropic etchants are typically, but not exclusively, wet chemical etchants.

Upon forming the microelectronics fabrication whose schematic cross-sectional diagram is illustrated in FIG. 6, there is formed a microelectronics fabrication having formed therein within a series of apertures within a topographic substrate layer employed within the microelectronics fabrication a series of patterned planarized aperture fill layers employing a non-polishing planarizing method. The microelectronics fabrication so formed is formed with attenuated microelectronics fabrication process complexity, attenuated microelectronics fabrication cost and enhanced patterned planarized aperture fill layer uniformity.

Second Preferred Embodiment

Figure 7:
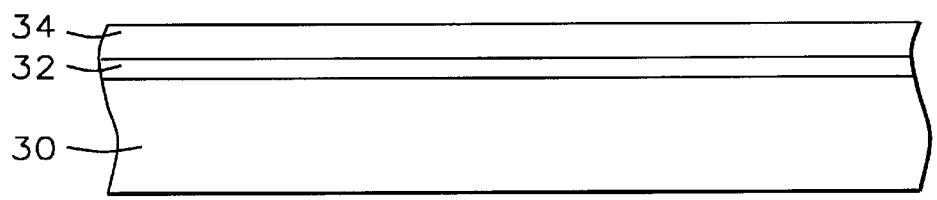
FIG. 7 to FIG. 13 show a series of schematic cross-sectional diagrams illustrating the results of forming within an integrated circuit microelectronics fabrication in accord with a more specific embodiment of the present invention which comprises a second preferred embodiment of the present invention a series of planarized trench isolation regions within a series of isolation trenches within a semiconductor substrate while employing the method of the present invention.

Referring now to FIG. 7 to FIG. 13, there is shown a series of schematic cross-sectional diagrams illustrating the results of forming within an integrated circuit microelectronics fabrication in accord with a more specific embodiment of the present invention which comprises a second preferred embodiment of the present invention a series of planarized trench isolation regions within a series of isolation trenches within a semiconductor substrate while employing the method of the present invention. Shown in FIG. 7 is a schematic cross-sectional diagram of the integrated circuit microelectronics fabrication at an early stage in its fabrication in accord with the method of the present invention.

Shown in FIG. 7 is a semiconductor substrate 30 upon which there is formed a blanket pad oxide layer 32 upon which in turn there is formed a blanket silicon nitride layer 34. Although semiconductor substrates are known in the art of integrated circuit microelectronics fabrication with either dopant polarity, various dopant concentrations and several crystallographic orientations, for the second preferred embodiment of the present invention the semiconductor substrate 30 is preferably a (100) silicon semiconductor substrate having an N- or P-doping.

Similarly, although it is also known in the art of integrated circuit microelectronics fabrication that blanket pad oxide layers may be formed upon semiconductor substrates employing methods including but not limited to blanket pad oxide thermal growth methods and blanket pad oxide deposition methods, for the second preferred embodiment of the present invention the blanket pad oxide layer 32 is preferably formed upon the semiconductor substrate 30 employing a blanket pad oxide layer thermal growth method at a temperature of from about 700 to about 900 degrees centigrade to form the blanket pad oxide layer 32 of silicon oxide of thickness from about 80 to about 150 angstroms upon the semiconductor substrate 30.

Finally, although it is similarly also known in the art of integrated circuit microelectronics fabrication that blanket silicon nitride layers may be formed employing methods including but not limited to chemical vapor deposition (CVD) methods, plasma enhanced chemical vapor deposition (PECVD) methods and physical vapor deposition (PVD) sputtering methods, for the second preferred embodiment of the present invention, the blanket silicon nitride layer 34 is preferably formed upon the blanket pad oxide layer 32 employing a chemical vapor deposition (CVD) method, as is conventional in the art of integrated circuit microelectronics fabrication, to form the blanket silicon nitride layer 34 of thickness from about 1000 to about 2000 angstroms.

Figure 8:
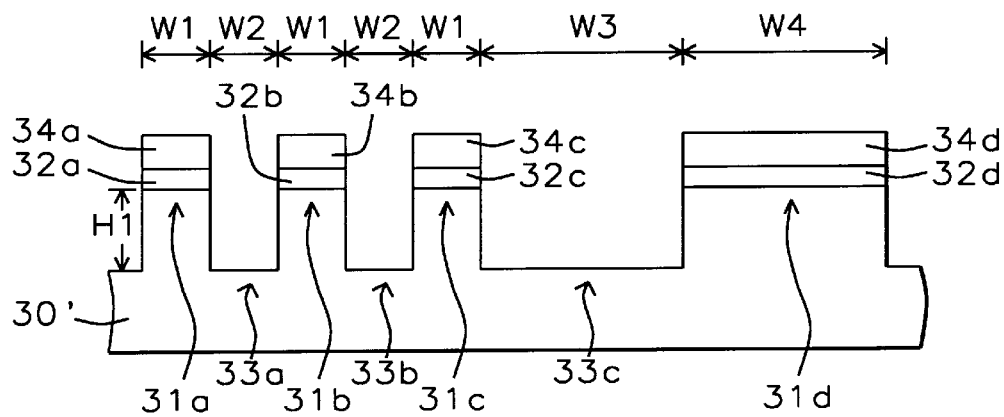

Referring now to FIG. 8, there is shown a schematic cross-sectional diagram illustrating the results of further processing of the integrated circuit microelectronics fabrication whose schematic cross-sectional diagram is illustrated in FIG. 7. Shown in FIG. 8 is a schematic cross-sectional diagram of an integrated circuit microelectronics fabrication otherwise equivalent to the integrated circuit microelectronics fabrication whose schematic cross-sectional diagram is illustrated in FIG. 7, but wherein there has been successively patterned: (1) the blanket silicon nitride layer 34; and (2) the blanket pad oxide layer 32, and subsequently etched the semiconductor substrate 30 to form a corresponding series of patterned silicon nitride layers 34*a*, 34*b*, 34*c* and 34*d*, a corresponding series of patterned pad oxide layers 32*a*, 32*b*, 32*c* and 32*d*, and an etched semiconductor substrate 30'. To form the integrated circuit microelectronics fabrication whose schematic cross-sectional diagram is illustrated in FIG. 8 from the integrated circuit microelectronics fabrication whose schematic cross-sectional diagram is illustrated in FIG. 7, there are employed photolithographic and etch methods as are conventional in the art of integrated circuit microelectronics fabrication. Such etch methods will typically, but not exclusively, include plasma etch methods employing: (1) fluorine containing etchant gas compositions for etching the blanket silicon nitride layer 34 and the blanket pad oxide layer 32 to form the corresponding patterned silicon nitride layers 34*a*, 34*b*, 34*c* and 34*d* and the corresponding patterned pad oxide layers 32*a*, 32*b*, 32*c* and 32*d*; and (2) chlorine containing etchant gas compositions for forming the etched silicon substrate 30' from the semiconductor substrate 30.

As is illustrated within the schematic cross-sectional diagram of FIG. 8, the etched semiconductor substrate 30' has formed therein a series of mesas 31*a*, 31*b*, 31*c* and 31*d* of height H1, where the mesas 31*a*, 31*b* and 31*c* are narrow mesas of width W1 separated by a pair of narrow isolation trenches 33*a* and 33*b* of width W2, and where the series of narrow mesas 31*a*, 31*b* and 31*c* is separated from a wide mesa 31*d* of width W4 by a wide isolation trench 33*c* of width W3. The values of: (1) mesa height and isolation trench depth H1; (2) narrow mesa 31*a*, 31*b* or 31*c* width W1; (3) narrow isolation trench 33*a* or 33*b* width W2; (4) wide isolation trench 33*c* width W3; and (5) wide mesa 31*d* width W4, are analogous or equivalent to the ranges of the values of: (1) mesa height and aperture depth H1; (2) narrow mesa 11*a*, 11*b* or 11*c* width W1; (3) narrow aperture 13*a* or 13*b* width W2; (3) wide aperture 13*c* width W3; and (4) wide mesa 11*d* width W4, employed within the microelectronics fabrication formed in accord with the first preferred embodiment of the present invention as illustrated within the schematic cross-sectional diagram of in FIG. 1.

Figure 9:
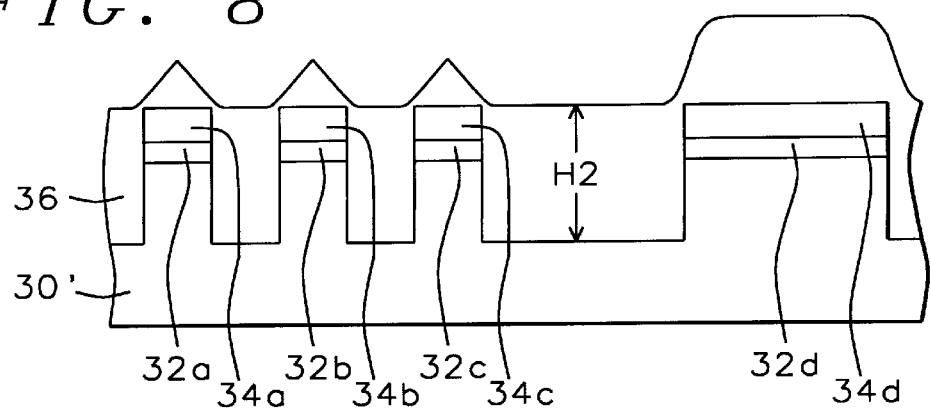

Referring now to FIG. 9, there is shown a schematic cross-sectional diagram illustrating the results of further processing of the microelectronics fabrication whose schematic cross-sectional diagram is illustrated in FIG. 8. Shown in FIG. 9 is a schematic cross-sectional diagram of a microelectronics fabrication otherwise equivalent to the microelectronics fabrication whose schematic cross-sectional diagram is illustrated in FIG. 8, but wherein there is formed upon the integrated circuit microelectronics fabrication a blanket trench fill dielectric layer 36 to a planarizing thickness within the isolation trenches 33*a*, 33*b* and 33*c* greater than the height of the mesas 31*a*, 31*b*, 31*c* and 31*d*. As is illustrated within the schematic cross-sectional diagram of FIG. 9, there is also formed within the blanket trench fill dielectric layer 36 a series of protrusions which correspond with the series of patterned silicon nitride layers 34*a*, 34*b*, 34*c* and 34*d*.

Within the second preferred embodiment of the present invention, the blanket trench fill dielectric layer 36 is, analogously with the blanket aperture fill layer 16 within the first preferred embodiment of the present invention, formed employing a deposition and sputtering method which provides the planarizing character of the blanket trench fill dielectric layer 36 at the location of the isolation trenches 33*a*, 33*b* and 33*c*. More preferably, within the second preferred embodiment of the present invention the blanket trench fill dielectric layer 36 is formed of a silicon oxide dielectric material deposited employing a high density plasma chemical vapor deposition (HDPCVD) method which employs a simultaneous deposition and sputtering when forming the blanket trench fill dielectric layer 36. Preferably, the high density plasma chemical vapor deposition (HDPCVD) method also employs: (1) a reactor chamber pressure of from about 3 to about 10 mtorr; (2) a side source radio frequency power of from about 2500 to about 3500 watts and a top source radio frequency power of from about 1000 to about 2000 watts at a source radio frequency of 13.56 MHZ; (3) a bias (sputtering) power of from about 1500 to about 3500 watts; (4) a side silane flow of from about 50 to about 200 standard cubic centimeters per minute (sccm) and a top silane flow of about 10 to about 30 standard cubic centimeters per minute (sccm); (5) a side oxygen flow rate of from about 150 to about 300 standard cubic centimeters per minute (sccm) and a top oxygen flow rate of from about 10 to about 50 standard cubic centimeters per minute (sccm); and (6) a side argon sputtering gas component flow rate of from about 100 to about 200 standard cubic centimeters per minute (sccm) and a top argon sputtering gas component flow rate of from about 10 to about 30 standard cubic centimeters per minute (sccm).

Figure 10:
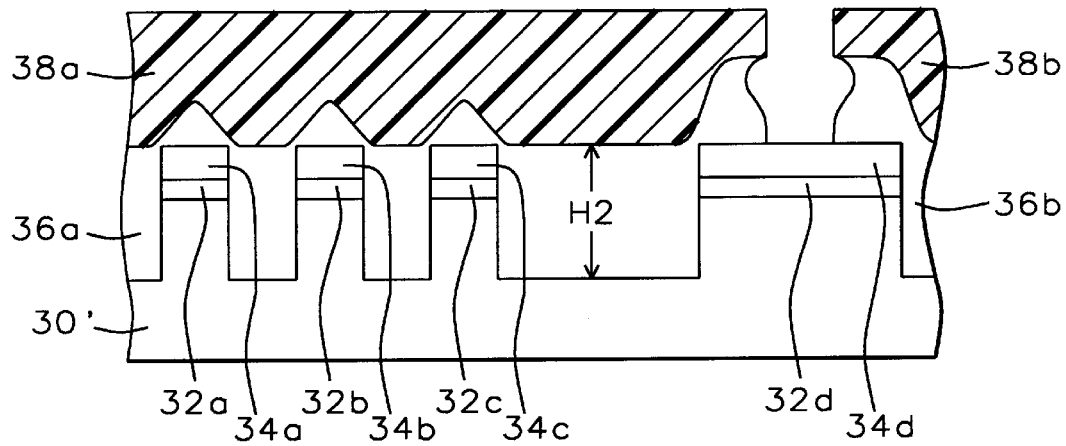

Referring now to FIG. 10, there is shown a schematic cross-sectional diagram illustrating the results of further processing of the integrated circuit microelectronics fabrication whose schematic cross-sectional diagram is illustrated in FIG. 9. Shown in FIG. 10 is a schematic cross-sectional diagram of an integrated circuit microelectronics fabrication otherwise equivalent to the integrated circuit microelectronics fabrication whose schematic cross-sectional diagram is illustrated in FIG. 9, but wherein: (1) there has been formed upon the integrated circuit microelectronics fabrication a pair of patterned photoresist layers 38a and 38b which expose a portion of the protrusion of the blanket trench fill dielectric layer 36 formed upon the patterned silicon nitride layer 34d; and (2) there is then etched the portion of the protrusion of the blanket trench fill dielectric layer 36 formed upon the patterned silicon nitride layer 34d until there is reached the patterned silicon nitride layer 34d.

Within the second preferred embodiment of the present invention, the pair of patterned photoresist layers 38a and 38b may be formed employing methods and materials analogous or equivalent to the methods and materials employed when forming the pair of patterned photoresist layers 18a and 18b within the microelectronics fabrication formed in accord with the first preferred embodiment of the present invention, as illustrated within the schematic cross-sectional diagram of FIG. 4A. Preferably, the patterned photoresist layers 38a and 38b are each formed to a teach formed to a thickness of from about 7000 to about 15000 angstroms. Similarly, the patterned trench fill dielectric layers 36a and 36b as illustrated within the schematic cross-sectional diagram of FIG. 10 are formed employing methods and materials analogous or equivalent to the methods and materials employed when forming the patterned aperture fill layers 16a and 16b within the first preferred embodiment of the present invention, as illustrated within the microelectronics fabrication whose schematic cross-sectional diagram is illustrated in FIG. 4A.

As illustrated within the schematic cross-sectional diagram of FIG. 10, within the second preferred embodiment of the present invention the patterned trench fill dielectric layers 36a and 36b are etched from the blanket trench fill dielectric layer 36 employing a first etch method which is an isotropic etch method. The first etch method preferably employs a 10:1 buffered oxide etchant which exhibits an etch rate selectivity of the blanket trench fill dielectric layer 36 with respect to the patterned silicon nitride layer 34d of at least about 10:1.

Figure 11:
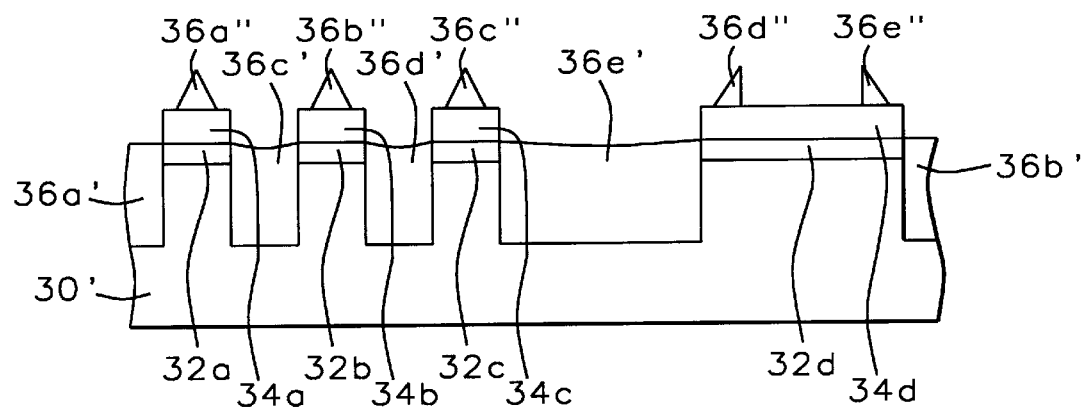

Referring now to FIG. 11, there is shown a schematic cross-sectional diagram illustrating the results of further processing of the microelectronics fabrication whose schematic cross-sectional diagram is illustrated in FIG. 10. Shown in FIG. 11 is a schematic cross-sectional diagram of an integrated circuit microelectronics fabrication otherwise equivalent to the integrated circuit microelectronics fabrication whose schematic cross-sectional diagram is illustrated in FIG. 10, but wherein: (1) there is stripped from the integrated circuit microelectronics fabrication the pair of patterned photoresist layers 38a and 38b; and (2) there is subsequently etched the patterned trench fill dielectric layers 36a and 36b to form: (a) the etched patterned planarized trench fill dielectric layers 36a', 36b', 36c', 36d' and 36e' within the trenches defined by the series mesas 31a, 31b, 31c and 31d; and (b) the etched patterned trench fill dielectric residue layers 36a", 36b", 36c", 36d" and 36e" upon the corresponding patterned silicon nitride layers 34a, 34b, 34c and 34d.

To form the integrated circuit microelectronics fabrication whose schematic cross-sectional diagram is illustrated in FIG. 11 from the integrated circuit microelectronics fabrication whose schematic cross-sectional diagram is illustrated in FIG. 10, the patterned photoresist layers 38a and 38b are preferably stripped from the integrated circuit microelectronics fabrication whose schematic cross-sectional diagram is illustrated in FIG. 10 to provide in part the integrated circuit microelectronics fabrication whose schematic cross-sectional diagram is illustrated in FIG. 11 employing methods and materials analogous or equivalent to the methods and materials through which the patterned photoresist layers 18a and 18b within the first preferred embodiment of the present invention are stripped from the microelectronics fabrication whose schematic cross-sectional diagram is illustrated in FIG. 4A to provide the microelectronics fabrication whose schematic cross-sectional diagram is illustrated in FIG. 5.

With respect to forming from the patterned trench fill dielectric layers 36a and 36b the etched patterned planarized trench fill dielectric layers 36a', 36b', 36c', 36d' and 36e', along with the etched patterned trench fill dielectric residue layers 36a", 36b", 36c", 36d" and 36e", there is preferably employed within the second preferred embodiment of the present invention an second isotropic wet chemical etchant, such as but not limited to an isotropic 10:1 buffered oxide etchant, preferably for a time period such that the etched patterned planarized trench fill dielectric layers 36a', 36b', 36c', 36d' and 36e' are formed to a thickness substantially equivalent to the height H1 of the mesas 31a, 31b, 31c and 31d, as illustrated within the schematic cross-sectional diagram of FIG. 8. Preferably, the isotropic etchant has an etch rate ratio of the patterned trench fill dielectric layers 36a and 36b with respect to the patterned silicon nitride layers 34a, 34b, 34c and 34d of at least about 10:1.

Figure 12:
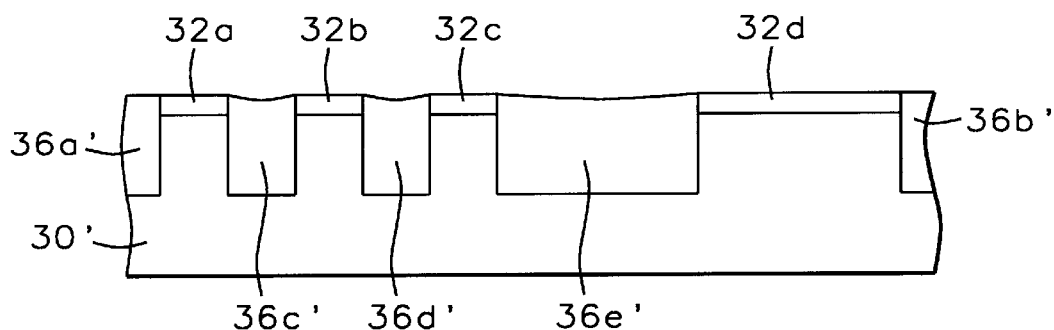

Referring now to FIG. 12, there is shown a schematic cross-sectional diagram illustrating the results of further processing of the integrated circuit microelectronics fabrication whose schematic cross-sectional diagram is illustrated in FIG. 11. Shown in FIG. 12 is a schematic cross-sectional diagram of an integrated circuit microelectronics fabrication otherwise equivalent to the integrated circuit microelectronics fabrication whose schematic cross-sectional diagram is illustrated in FIG. 11, but wherein the patterned silicon nitride layers 34a, 34b, 34c and 34d have been stripped from the integrated circuit microelectronics fabrication, and in conjunction therewith there is removed from the integrated circuit microelectronics fabrication the series of etched patterned trench fill dielectric residue layers 36a", 36b", 36c", 36d" and 36e".

Within the second preferred embodiment of the present invention, the patterned silicon nitride layers 34a, 34b, 34c, 34d and 34e are stripped from the integrated circuit microelectronics fabrication whose schematic cross-sectional diagram is illustrated in FIG. 12 to provide the integrated circuit microelectronics fabrication whose schematic cross-sectional diagram is illustrated in FIG. 12 employing a third isotropic etch method employing a third isotropic etchant which is selective to the patterned silicon nitride layers 34a, 34b, 34c and 34d with respect to the etched patterned planarized trench fill dielectric layers 36a', 36b', 36c', 36d' and 36e'. Preferably, within the second preferred embodiment of the present invention, the third isotropic enchant is a wet chemical isotropic enchant comprising an aqueous phosphoric acid solution, typically at an elevated temperature of from about 50 to about 90 degrees centigrade, to provide a selectivity of the third isotropic enchant for the patterned silicon nitride layers 34a, 34b, 34c and 34d with respect to the etched patterned planarized trench fill dielectric layers 34a', 34b', 34c', 34d' and 34e' of at least about 10:1.

Figure 13:
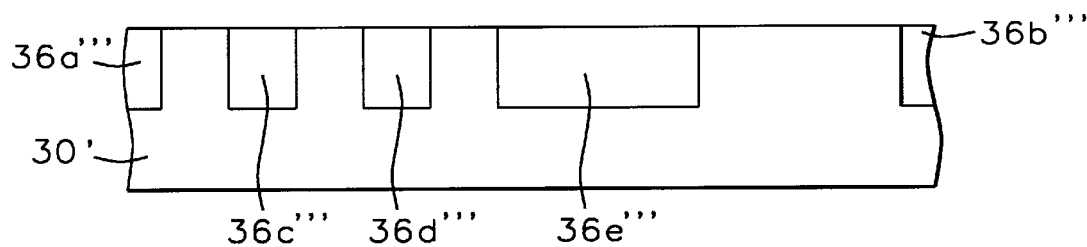

Referring now to FIG. 13, there is shown a schematic cross-sectional diagram illustrating the results of further processing of the integrated circuit microelectronics fabrication whose schematic cross-sectional diagram is illustrated in FIG. 12. Shown in FIG. 13 is a schematic cross-sectional diagram of an integrated circuit microelectronics fabrication otherwise equivalent to the integrated circuit microelectronics fabrication whose schematic cross-sectional diagram is illustrated in FIG. 12, but wherein: (1) the patterned pad oxide layers 32a, 32b, 32c and 32d have been stripped from the integrated circuit microelectronics fabrication; and (2) the etched patterned trench fill dielectric layers 36a', 36b', 36c', 36d' and 36e' have been further etched to form the twice etched patterned trench fill dielectric layers 36a'', 36b'', 36c'', 36d'' and 36e'' substantially co-planar with the adjoining mesas within the etched silicon semiconductor substrate 30'.

To form the integrated circuit microelectronics fabrication whose schematic cross-sectional diagram is illustrated in FIG. 13 from the integrated circuit microelectronics fabrication whose schematic cross-sectional diagram is illustrated in FIG. 12, there is typically additionally etched the integrated circuit microelectronics fabrication whose schematic cross-sectional diagram is illustrated in FIG. 12 within either: (1) an isotropic etchant analogous or equivalent to the isotropic etchant which is employed in forming from the patterned trench fill dielectric layers 36a and 36b whose schematic cross-sectional diagram is illustrated within FIG. 1 the etched patterned planarized trench fill dielectric layers 36a', 36b', 36c', 36d' and 36e' within the integrated circuit microelectronics fabrication whose schematic cross-sectional diagram is illustrated in FIG. 11; or (2) an anisotropic etchant, such as but not limited to an anisotropic plasma etchant. Within the second preferred embodiment of the present invention, such anisotropic plasma etchants will typically and preferably be fluorine containing plasma etchants employed within anisotropic plasma etch methods.

Upon forming the integrated circuit microelectronics fabrication whose schematic cross-sectional diagram is illustrated in FIG. 13, there is formed an integrated circuit microelectronics fabrication comprising a semiconductor substrate having a series of isolation trenches formed therein, where there is formed within the series of isolation trenches formed within the semiconductor substrate a series of planarized trench isolation regions employing a non-polishing method. Within the second preferred embodiment of the present invention, the integrated circuit microelectronics fabrication is formed with attenuated process complexity, attenuated integrated circuit microelectronics fabrication cost and enhanced planarized trench isolation region uniformity.

As is understood by a person skilled in the art, the preferred embodiments of the present invention are representative of the present invention rather than limiting of the present invention. Revisions and modifications may be made to methods, materials, structures and dimensions through which are formed the preferred embodiments of the present invention while still providing embodiments which are within the spirit and scope of the present invention, as defined by the appended claims.

What is claimed is:

1. A non-polishing planarizing method for forming a planarized aperture fill layer within an aperture within a topographic substrate layer employed within a microelectronics fabrication comprising:

providing a topographic substrate layer employed within a microelectronics fabrication, the topographic substrate layer comprising a series of mesas of substantially equivalent height but of differing widths, the series of mesas being separated by a series of apertures, the series of mesas having formed upon their upper surfaces a corresponding series of patterned sacrificial layers, each patterned sacrificial layer within the series of patterned sacrificial layers having a width coextensive with a width of a mesa upon which it is formed;

forming upon the topographic substrate layer and the series of patterned sacrificial layers a blanket aperture fill layer, the blanket aperture fill layer being formed employing a deposition and sputter method, the blanket aperture fill layer filling the series of apertures to a planarizing thickness greater than the height of the mesas while simultaneously forming a series of protrusions of the blanket aperture fill layer corresponding with the locations of the series of patterned sacrificial layers;

masking with a mask layer the blanket aperture fill layer to leave exposed at least a protrusion of the blanket aperture fill layer formed upon a widest of the patterned sacrificial layers;

etching while employing the mask layer and a first etch method at least a portion of the protrusion of the blanket aperture fill layer formed upon the widest of the patterned sacrificial layers to form a remaining blanket aperture fill layer;

stripping from the remaining blanket aperture fill layer the mask layer;

etching while employing an isotropic second etch method which is selective to the remaining blanket aperture fill layer with respect to the patterned sacrificial layers the remaining blanket aperture fill layer to form a series of patterned planarized aperture fill layers separated by the series of mesas, the thickness of each patterned planarized aperture fill layer being substantially equivalent to the height of the mesas; and stripping while employing an isotropic third etch method which is selective to the patterned sacrificial layers with respect to the patterned planarized aperture fill layers the patterned sacrificial layers from the topographic substrate layer to leave remaining the series of patterned planarized aperture fill layers substantially co-planar with the series of mesas which comprises the topographic substrate layer.

2. The method of claim 1 wherein the microelectronics fabrication is selected from the group consisting of integrated circuit microelectronics fabrications, solar cell microelectronics fabrications, ceramic substrate microelectronics fabrications and flat panel display microelectronics fabrications.

3. The method of claim 1 wherein the topographic substrate layer is selected from the group consisting of topographic conductor substrate layers, topographic semiconductor substrate layers, topographic insulator substrate layers, and composites thereof.

4. The method of claim 1 wherein the blanket planarizing aperture fill layer is formed from an aperture fill material selected from the group consisting of conductor aperture fill materials, semiconductor aperture fill materials and insulator aperture fill materials.

5. A microelectronics fabrication having formed therein a series of patterned planarized aperture fill layers within a topographic substrate layer in accord with the method of claim 1.

6. A non-polishing planarizing method for forming a planarized trench isolation region within an isolation trench within a semiconductor substrate employed within an integrated circuit microelectronics fabrication comprising:

providing a semiconductor substrate, the semiconductor substrate comprising a series of mesas of substantially equivalent height but of differing widths, the series of mesas defining a series of isolation trenches, the series of mesas having formed upon their upper surfaces a corresponding series of patterned sacrificial layers, each patterned sacrificial layer within the series of patterned sacrificial layers having a width coextensive with a width of a mesa upon which it is formed;

forming upon the semiconductor substrate and the series of patterned sacrificial layers a blanket trench fill dielectric layer, the blanket trench fill dielectric layer being formed employing a deposition and sputter method, the blanket trench fill dielectric layer filling the series of isolation trenches to a planarizing thickness greater than the height of the mesas while simultaneously forming a series of protrusions of the blanket trench fill dielectric layer corresponding with the locations of the series of patterned sacrificial layers;

masking with a mask layer the blanket trench fill dielectric layer to leave exposed at least a protrusion of the blanket trench fill dielectric layer formed upon a widest of the patterned sacrificial layers;

etching while employing the mask layer and a first etch method at least a portion of the protrusion of the blanket trench fill dielectric layer formed upon the widest of the patterned sacrificial layers to form a remaining blanket trench fill dielectric layer;

stripping from the remaining blanket trench fill dielectric layer the mask layer;

etching while employing an isotropic second etch method which is selective to the remaining blanket trench fill dielectric layer with respect to the patterned sacrificial layers the remaining blanket trench fill dielectric to form a series of patterned planarized trench isolation regions separated by the series of mesas, the thickness of each patterned planarized trench isolation region being substantially equivalent to the height of the mesas; and stripping while employing an isotropic third etch method which is selective to the patterned sacrificial layers with respect to the patterned planarized trench fill dielectric layers the patterned sacrificial layers from the topographic substrate layer to leave remaining the series of patterned planarized trench fill dielectric layers substantially co-planar with the series of mesas which comprises the semiconductor substrate.

7. The method of claim 6 wherein the series of sacrificial layers is formed of a silicon nitride material and the blanket trench fill dielectric layer is formed of a silicon oxide dielectric material.

8. An integrated circuit microelectronics fabrication having formed within a semiconductor substrate a series of patterned planarized trench isolation regions in accord with the method of claim 6.

\* \* \* \* \*